United States Patent [19]

Buchwald et al.

[11] Patent Number: 5,271,861
[45] Date of Patent: Dec. 21, 1993

[54] FLUOROCHLOROHYDROCARBON-FREE CLEANING COMPOSITIONS

[75] Inventors: Hans Buchwald, Ronnenberg; Andreas Brackmann, Hanover; Boleslaus Raschkowski, Wiedensahl, all of Fed. Rep. of Germany

[73] Assignee: Kali-Chemie AG, Hanover, Fed. Rep. of Germany

[21] Appl. No.: 750,300

[22] Filed: Aug. 27, 1991

[30] Foreign Application Priority Data

Aug. 30, 1990 [DE] Fed. Rep. of Germany ....... 4027446

[51] Int. Cl.$^5$ .......................... C11D 3/20; C11D 3/24; C11D 10/02; C23G 5/032
[52] U.S. Cl. ...................................... 252/153; 134/38; 134/40; 134/42; 252/162; 252/170; 252/171; 252/364; 252/546; 252/558; 252/174.21
[58] Field of Search .............. 252/153, 162, 170, 171, 252/364, 546, 558, 174.21; 134/38, 40, 42

[56] References Cited

U.S. PATENT DOCUMENTS

| | | | |
|---|---|---|---|
| 3,131,152 | 4/1964 | Klausner | 252/305 |
| 3,239,468 | 3/1966 | Herrick | 252/153 |
| 3,654,165 | 4/1972 | Bryant et al. | 252/106 |
| 3,696,042 | 10/1972 | Wright | 252/162 |
| 3,697,451 | 10/1972 | Mausner et al. | 252/153 |
| 4,294,729 | 10/1981 | Bakos et al. | 252/545 |
| 4,443,364 | 4/1984 | Klinger et al. | 252/106 |
| 4,464,293 | 8/1984 | Dobrin | 252/547 |
| 4,678,658 | 7/1987 | Casey et al. | 252/106 |
| 4,925,462 | 5/1990 | Glass et al. | 55/37 |
| 5,041,235 | 8/1991 | Kilbarger | 252/170 |

FOREIGN PATENT DOCUMENTS

| | | | |
|---|---|---|---|
| 394994 | 10/1990 | European Pat. Off. | |
| 3435452 | 4/1986 | Fed. Rep. of Germany. | |
| 52-18220 | 5/1977 | Japan | 134/38 |
| 55-144100 | 11/1980 | Japan | 252/162 |
| 1573908 | 8/1980 | United Kingdom. | |
| 2188059 | 9/1987 | United Kingdom | 252/67 |

OTHER PUBLICATIONS

McCutcheons Emulsifiers & Detergents 1982* N. American Ed. p. 277.
Kirk-Othmer, *Encyclopedia of Chemical Technology*, Third Edition, vol. 22, pp. 350-351, Wiley, New York (1983).

*Primary Examiner*—Linda Skaling
*Attorney, Agent, or Firm*—Evenson, McKeown, Edwards & Lenahan

[57] ABSTRACT

Fluorochlorohydrocarbon-free cleaning compositions composed of from 80 to 99.5 percent by weight of an alcohol or partially fluorinated alcohol having 2 to 4 carbon atoms and 0.5 to 10 percent by weight of at least one surface-active agent selected from ammonium salts of alkyl benzene sulfonates and mixtures of fatty acid alkanolamides and alkyl phenol polyglycol ethers, and 0 to 10 percent by weight of deionized water.

11 Claims, No Drawings

FLUOROCHLOROHYDROCARBON-FREE CLEANING COMPOSITIONS

BACKGROUND OF THE INVENTION

This invention relates to fluorochlorohydrocarbon-free cleaning compositions composed of alcohols.

High demands relating to the solvent properties with respect to the impurities to be removed are made on solvents for cleaning electronic components, printed circuit boards, sensitive apparatus components, precision instruments and protective circuits, such as ground fault circuit breakers. Since these demands cannot as a rule be met by only one single pure solvent, solvent mixtures are often used in the prior art for industrial cleaning processes. Many prior art solvent mixtures contain fluorochlorohydrocarbons as the main solvent due to their well-known good solvent properties. However, the fluorochlorohydrocarbons have the major disadvantage that they contribute to the dangerous decrease of the ozone content in the upper air layers of the Earth's atmosphere. Due to this environment-harming property of fluorochlorohydrocarbons, it is desirable to replace cleaning compositions which contain these fluorochlorohydrocarbons with alternative cleaning compositions which contain solvents which are less harmful in this respect. Furthermore, it is already known in the prior art to add alcohols as co-solvents to the fluorochlorohydrocarbons; the use of alcohols alone as the main solvent was not successful in difficult applications.

SUMMARY OF THE INVENTION

It is the object of the present invention to provide a new solvent cleaning composition.

A further object of the invention is to provide a solvent cleaning composition which exhibits a sufficient solvent power to meet the high requirements placed on modern solvent cleaning compositions, particularly in the electronics industry.

Another object of the present invention is to provide a solvent cleaning composition with high solvent power which will not contribute to the depletion of the ozone layer in the upper atmosphere of the Earth.

These and other objects of the invention are achieved by providing a fluorochlorohydrocarbon-free cleaning composition composed of alcohols, said composition consisting essentially of from 99.5 to 80.0% by weight of a monovalent, optionally partially fluorinated C2 to C4 alcohol; and from 0.5 to 10% by weight of a surface-active agent selected from the group consisting of ammonium salts of alkyl benzene sulfonates and mixtures of fatty acid alkanolamides and alkyl phenol polyglycol ethers; and from 0 to 10% by weight deionized water; the sum of the constituents being 100 wt. %.

DETAILED DESCRIPTION OF PREFERRED EMBODIMENTS

It has been found that cleaning compositions consisting of 99.5 to 80.0% by weight of a monovalent, optionally partially fluorinated C2 to C4 alcohol, 0.5 to 10% by weight of a surface-active agent which is selected from ammonium salts of alkyl benzene sulfonates and/or mixtures of fatty acid alkanolamides and alkyl phenol polyglycol ethers, and optionally up to 10.0% by weight deionized water, the sum of the constituents being 100% by weight, are well suited for industrial cleaning processes, although they do not contain any fluorochlorohydrocarbon solvents. In one configuration of the invention, the cleaning compositions according to the invention are distinguished in that they are aqueous compositions which contain from 1.0 to 10.0% by weight water. In a further configuration of the cleaning compositions according to the invention, they are distinguished in that they contain 0.5 to 5.0% by weight of the surface-active agent.

In one variant of the invention, the cleaning compositions contain a mixture of fatty acid alkanolamide and alkyl phenol polyglycol ethers as the surface-active agent. Suitable fatty acid alkanolamides include, for example, N-alkylated fatty acid amides of the general formula $R^1$—CO—N($R^2$)—$(CH_2)_n$—OH, which are obtained by reacting alkanolamines with fatty acids, fatty acid methyl esters or fatty acid glycerides, wherein $R^1$ represents a saturated or unsaturated fatty acid radical, $R^2$ represents hydrogen in monoalkanolamines or —$(CH_2)_n$—OH in fatty acid dialkanolamides, and n is an integer from 1 to 6, but preferably the number 2. Those fatty acid dialkanolamides, especially fatty acid diethanolamides, in which the group $R^1$ is the fatty acid radical of lauric acid, myristic acid, palmitic acid, stearic acid, oleic acid and optionally also a fatty acid radical of the coconut fatty acids, are especially preferred.

Suitable alkyl phenol polyglycol ethers include, for example, those having medium chain alkyl groups, i.e. with the C8 to C12 alkyl groups octyl, nonyl, decyl, undecyl or dodecyl, and having 5 to 8 ethylene oxide units.

In a preferred configuration of this variant of the invention, the cleaning compositions contain a mixture of oleic acid diethanolamide and nonyl phenol polyglycol ether with 7 to 8 ethylene oxide units. Cleaning compositions in which the oleic acid diethanolamide and the nonyl phenol polyglycol ethers are present in a weight ratio of 5:1 are especially preferred.

In another variant of the cleaning compositions according to the invention, the surface-active agent is an ammonium salt of an alkyl benzene sulfonate.

Suitable alkyl benzene sulfonates include, for example, those with medium chain alkyl groups, i.e. with the C8 to C12 alkyl groups octyl, nonyl, decyl, undecyl or dodecyl. The cleaning compositions according to the invention may contain ammonium salts of the alkyl benzene sulfonates with for instance the following amines with 2 to 6 carbon atoms: diethylamine, n-propylamine, isopropylamine, diisopropylamine, n-butylamine, isobutylamine, tert.-butylamine, cyclohexylamine. In a preferred configuration of this variant of the invention, the cleaning compositions are distinguished in that they contain isopropyl ammonium dodecyl benzene sulfonate as the alkyl benzene sulfonate ammonium salt.

In one variant of the cleaning compositions according to the invention, the alcohol contained in the cleaning composition of the invention may be ethanol, propanol, isopropanol and/or butanol. Preferred alcohols of this variant of the invention are ethanol an in particular isopropanol.

In another variant of the cleaning compositions according to the invention, the alcohol is a partially fluorinated alcohol. Partially fluorinated alcohols within the scope of the invention are those alcohols which, in addition to the OH group and the two to four carbon atoms, contain hydrogen and at least one fluorine atom. Suitable partially fluorinated alcohols with 2 to 4 carbon atoms useful in the compositions according to the invention include, for example, 2-fluoroethanol, 1,1-difluoroethanol-(2), 2,2,2-trifluoroethanol, 2-fluoropropanol, 3-fluoropropanol, 3,3-difluoropropanol, 2,2-difluoropropanol, 1,1-difluoropropanol-(2), 3,3,3-trifluoropropanol, 2,3,3,3-tetrafluoropropanol,2,2,3,3-tetrafluoropropanol,2,2,3,3,3-pentafluoropropanol, 4-fluorobutanol and 4,4,4-trifluorobutanol. 2,2,2-trifluoroethanol (hereinafter referred to as trifluoroethanol), 2,2,3,3-tetrafluoropropanol, and in particular 2,2,3,3,3-pentafluoropropanol are especially preferred.

The foregoing cleaning compositions have numerous applications in the cleaning sector. In conventional cleaning processes, the object to be cleaned is dipped into a liquid cleaning composition or is sprayed with a liquid cleaning composition in one or more stages. In the case of less sensitive objects which are to be cleaned, the cleaning action may also be increased by suitable measures, for instance ultrasound and/or stirring, or also by mechanical action, such as brushing.

The cleaning compositions according to the invention are particularly suitable for cleaning electronic components, printed circuit boards, sensitive apparatus components, precision instruments and protective circuits, such as ground fault circuit breakers. The high requirements for the cleaning of these objects are well met by the cleaning compositions according to the invention. The cleaning compositions according to the invention are particularly well suited for removing organic resin fluxes such as are used in the electronics industry for soldering processes, and the residues of which have to be removed from circuit boards after the soldering operation. The resin fluxes to be removed are mixtures of polar and non-polar compounds and often contain additional special activators, which on one hand do promote the soldering operation, but on the other hand render it more difficult to remove the resin soldering flux from the surfaces to be cleaned. Such activators may be, for example, organic halogen-containing activators, such as glutamic acid hydrochloride, or organic halogen-free activation additives, such as stearic, salicylic or adipic acid. Surprisingly, these resin fluxes, and in particular even those with high activator content, can be removed well with the cleaning compositions according to the invention. Thus circuit boards with or without inserted components (in particular also with SMD-components) can be cleaned, even when using fluxes having high activator contents.

The cleaning compositions according to the invention may for instance also be used for cleaning miniaturized parts or bulk material, and also for removing grease and fingerprints or polar substances from electronic components, e.g. from silicon wafers.

The cleaning effect obtainable with the cleaning compounds according to the invention is surprising, since the surface tensions of the cleaning compositions, despite the surface-active agents contained therein, are scarcely less than the values for the pure alcohols or even, particularly in the case of the water-containing compositions, are higher than the values of the pure alcohols.

The following examples are intended to illustrate the invention in further detail without limiting its scope. Unless otherwise indicated, percentages always refer to percent by weight.

EXAMPLE 1

Cleaning of Circuit Boards

Cleaning tests with circuit boards which were contaminated both with conventional halogen-containing soldering fluxes and with high-activator-containing soldering fluxes were carried out in a commercially available multi-chamber cleaning unit. The circuit boards to be cleaned were contaminated with the following resin fluxes:

A: Resin fluxes composed of natural or modified natural resins with organic halogen-free activation additives (e.g. stearic acid, salicylic acid or adipic acid), but without amines, diamines or urea; two commercially available fluxes of the type F-SW-32 (A1 and A2) Were used.

B: Resin fluxes composed natural resins or modified natural resins with additions of organic halogen-containing activators (e.g. glutamic acid hydrochloride); a commercially available flux of the type F-SW-26 (B) was used.

For cleaning, i.e. for removing the resin fluxes, the circuit boards to be cleaned were dipped for three minutes with ultrasound into a first cleaning bath (for bath composition see Table 1), then dipped for one minute with ultrasound into a second cleaning bath, and then rinsed for one further minute in a vapor chamber (in the second cleaning bath and in the vapor chamber the respective pure alcohol was used). It was possible to effectively remove from the circuit boards both the impurities due to the conventional halogen-containing soldering fluxes and the impurities resulting from high-activator-containing soldering fluxes. The results obtained in the tests using the cleaning compositions according to the invention are set forth in the following Table 1.

TABLE 1

| Test No. | Compositions according to the invention Composition in Bath 1 | Resin Flux | Cleaning Result |
|---|---|---|---|
| 1 | 95% ethanol<br>5% ODA/NPE | A1 | ++ |
| 2 | 95% ethanol<br>5% IDS | A1 | ++ |
| 3 | 95% ethanol<br>5% IDS | A2 | + |
| 4 | 95% isopropanol<br>5% ODA/NPE | A1 | ++ |
| 5 | 95% isopropanol<br>5% IDS | A1 | ++ |
| 6 | 95% isopropanol<br>5% IDS | A2 | ++ |
| 7 | 95% isopropanol<br>5% IDS | B | ++ |
| 8 | 95% pentafluoropropanol<br>5% ODA/NPE | A1 | + |
| 9 | 95% pentafluoropropanol<br>5% ODA/NPE | A2 | + |
| 10 | 95% pentafluoropropanol<br>5% ODA/NPE | B | + |
| 11 | 95% pentafluoropropanol<br>5% IDS | A1 | + |
| 12 | 95% pentafluoropropanol<br>5% IDS | A2 | ++ |
| 13 | 95% pentafluoropropanol<br>5% IDS | B | ++ |

ODA/NPE = oleic acid diethanolamide/nonyl phenol polyglycol ether (5:1)
IDS = isopropyl ammonium dodecyl benzene sulfonate In the cases marked "++" in the "Cleaning Result" column, a very good cleaning effect was achieved, and in the cases marked "+" a good cleaning effect was obtained, and there was no formation of "white coatings" on the circuit boards to be cleaned. From these results it is clearly apparent that the compositions according to the invention show effective cleaning powers.

COMPARISON EXAMPLE

For comparison purposes, some circuit boards contaminated with the resin fluxes (A2, B) which are more difficult to remove were cleaned with pure alcohols analogously to Example 1. The cleaning results are compiled in the following Table 2:

TABLE 2

| | Comparison tests | | |
|---|---|---|---|
| Test No. | Composition in Bath 1 | Resin Flux | Cleaning Result |
| V1 | Ethanol | A2 | clear residues |
| V2 | Isopropanol | A2 | slight residues |
| V3 | Isopropanol | B | strong residues |
| V4 | Pentafluoropropanol | A2 | slight residues |
| V5 | Pentafluoropropanol | B | white coatings |

The cleaning tests of Example 1 (Table 1, Nos. 1 to 13) and of the comparison example (Table 2, Nos. V1 to V5) show that pure alcohols can only be used to a very limited extent for removing fluxes, but that the compositions according to the invention, on the other hand, ensure effective, successful cleaning. This is all the more surprising since the compositions according to the invention of Example 1 only have a slightly reduced surface tension compared with the pure alcohol. The cleaning action of compositions composed of isopropanol is higher than the cleaning action of compounds composed of ethanol. Particularly highly successful cleaning is achieved with compositions which contain isopropyl ammonium dodecyl benzene sulfonate as the surface-active agent.

As the tests of Example 1 and the comparison example further show, when pure pentafluoropropanol is used for removing fluxes, at best a minimally satisfactory cleaning result is achieved. In contrast, the compositions according to the invention composed of pentafluoropropanol which contain one of the above surface-active agents, but in particular isopropyl ammonium dodecyl benzene sulfonate, assure impeccable cleaning success.

EXAMPLE 2

Cleaning of Silicon Discs

Silicon discs (silicon wafers) were cleaned analogously to Example 1 (3 minutes ultrasound, 1 minute ultrasound, 1 minute vapor degreasing) with a composition in bath 1 composed of 95% by weight ethanol and 5% by weight of a (5:1) mixture of oleic acid and diethanolamide/nonyl phenol polyglycol ether in order to remove fingerprints. After the treatment, the silicon wafers were impeccably clean.

The foregoing description and examples have been set forth merely to illustrate the invention and are not intended to be limiting. Since modifications of the described embodiments incorporating the spirit and substance of the invention may occur to persons skilled in the art, the scope of the invention should be construed to include all variations falling within the ambit of the appended claims and equivalents thereof.

What is claimed is:

1. A fluorochlorohydrocarbon-free cleaning composition consisting of:

from 99.5 to 80.0% by weight of a monovalent C2 to C4 alcohol, or a monovalent partially fluorinated C2 to C4 alcohol; and from 0.5 to 10% by weight of a surface-active agent selected from the group consisting of ammonium salts of C8 to C12 alkyl benzene sulfonates and mixtures of fatty acid alkanolamides corresponding to the formula $R^1$—CO—$N(R^2)$—$(CH_2)_n$—OH, wherein $R^1$—CO is a saturated or unsaturated fatty acid radical, and $R^2$ is hydrogen or —$(CH_2)_n$—OH and n is an integer from 1 to 6, and C8 to $C_{12}$ alkyl phenol polyglycol ethers having 5 to 8 ethylene oxide units; and from 0 to 10% by weight deionized water; the sum of the constituents being 100% by weight; said composition being suitable for cleaning flux residues from electronic components by spraying or immersion in a bath thereof.

2. A cleaning composition according to claim 1, containing from 1.0 to 10.0% by weight water.

3. A cleaning composition according to claim 1, containing from 0.5 to 5.0% by weight of said surface-active agent.

4. A cleaning composition according to claim 1, wherein said fatty acid alkanolamide/alkyl phenol polyglycol ether mixture is a mixture of oleic acid diethanolamide and nonyl phenol polyglycol ethers with 7 to 8 ethylene oxide units.

5. A cleaning composition according to claim 4, wherein said oleic acid diethanolamide and said nonyl phenol polyglycol ethers are present in a weight ratio of 5:1.

6. A cleaning composition according to claim 1, wherein said alkyl benzene sulfonate ammonium salt is isopropyl ammonium dodecyl benzene sulfonate.

7. A cleaning composition according to claim 1, wherein said alcohol is ethanol or isopropanol.

8. A cleaning composition according to claim 1, wherein said alcohol is a partially fluorinated alcohol.

9. A cleaning composition according to claim 8, wherein said partially fluorinated alcohol is pentafluoropropanol.

10. A process for cleaning flux residues from the surface of electronic components contaminated therewith, said process comprising the step of spraying said surface to be cleaned with or immersing said surface to be cleaned in a fluorochlorohydrocarbon-free cleaning composition consisting of:

from 99.5 to 80.0% by weight of a monovalent C2 to C4 alcohol, or a monovalent partially fluorinated C2 to C4 alcohol; and from 0.5 to 10% by weight of a surface-active agent selected from the group consisting of ammonium salts of C8 to C12 alkyl benzene sulfonates and mixtures of fatty acid alkanolamides corresponding to the formula $R^1$—CO—$N(R^2)$—$(CH_2)_n$—OH, wherein $R^1$—CO is a saturated or unsaturated fatty acid radical, and $R^2$ is hydrogen or —$(CH_2)_n$—OH and n is an integer from 1 to 6, and C8 to C12 alkyl phenol polyglycol ethers having 5 to 8 ethylene oxide units; and from 0 to 10% by weight deionized water; the sum of the constituents being 100% by weight.

11. A process according to claim 10, wherein said surface to be cleaned is a surface contaminated with at least one substance selected from the group consisting of soldering fluxes, soldering flux residues, fingerprints, and polar substances.

* * * * *